(12) United States Patent
Loy et al.

(10) Patent No.: US 6,337,384 B1
(45) Date of Patent: Jan. 8, 2002

(54) METHOD OF MAKING THERMALLY REMOVABLE EPOXIES

(75) Inventors: Douglas A. Loy; David R. Wheeler, both of Albuquerque; Edward M. Russick, Rio Rancho; James R. McElhanon, Albuquerque; Randall S. Saunders, deceased, late of Albuquerque, all of NM (US), by Marvie Lou Durbin-Voss, legal representative

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/484,839

(22) Filed: Jan. 18, 2000

(51) Int. Cl.$^7$ .......................... C08G 59/26; C08G 65/20; C08K 3/10; C08L 63/00

(52) U.S. Cl. .................. 528/393; 521/135; 521/178; 523/428; 523/429; 525/410; 525/526; 528/322; 528/417

(58) Field of Search ................ 528/393, 417, 528/322; 525/410, 528, 526; 523/418, 429, 428

(56) References Cited

U.S. PATENT DOCUMENTS

| | | | | |
|---|---|---|---|---|
| 2,906,738 A | * | 9/1959 | Goldberg | 525/410 X |
| 3,491,041 A | * | 1/1970 | Dornte | 528/417 X |
| 3,978,152 A | * | 8/1976 | Gruffaz et al. | 528/322 X |
| 4,005,154 A | * | 1/1977 | Bargain | 528/322 X |
| 4,122,076 A | * | 10/1978 | Jablonski et al. | 528/322 |
| 4,237,262 A | * | 12/1980 | Jones | 528/322 |
| 4,393,188 A | * | 7/1983 | Takahashi et al. | 528/322 X |
| 4,687,812 A | | 8/1987 | Dickie et al. | 525/112 |
| 5,000,899 A | * | 3/1991 | Dreibelbis et al. | 524/410 X |
| 5,021,519 A | * | 6/1991 | Varde et al. | 528/322 X |
| 5,164,463 A | * | 11/1992 | Ho et al. | 528/322 X |
| 5,254,605 A | * | 10/1993 | Kim et al. | 523/429 X |
| 5,491,210 A | | 2/1996 | Onwumere et al. | 528/28 |
| 5,560,934 A | * | 10/1996 | Afzali-Ardakani et al. | 528/94 X |
| 5,641,856 A | | 6/1997 | Meurs | 528/310 |
| 5,643,998 A | * | 7/1997 | Nakano et al. | 525/528 X |
| 5,726,391 A | | 3/1998 | Iyer et al. | 174/52.2 |
| 5,760,337 A | | 6/1998 | Iyer et al. | 174/52.2 |

FOREIGN PATENT DOCUMENTS

| | | | | |
|---|---|---|---|---|
| SU | 332 108 | * | 4/1972 | 528/393 |
| SU | 1 207 122 | * | 8/1987 | 528/322 |

OTHER PUBLICATIONS

Laita, H., Boufi, S., and Gandini, A., "The application of the Diels–Alder reaction to polymers bearing furan moieties. 1. Reactions with maleimides," Eur. Polym. J., 1997, 33, 8, 1203–1211.

* cited by examiner

*Primary Examiner*—Richard D. Lovering
(74) *Attorney, Agent, or Firm*—Elmer A. Klavetter

(57) ABSTRACT

A method of making a thermally-removable epoxy by mixing a bis(maleimide) compound to a monomeric furan compound containing an oxirane group to form a di-epoxy mixture and then adding a curing agent at temperatures from approximately room temperature to less than approximately 90° C. to form a thermally-removable epoxy. The thermally-removable epoxy can be easily removed within approximately an hour by heating to temperatures greater than approximately 90° C. in a polar solvent. The epoxy material can be used in protecting electronic components that may require subsequent removal of the solid material for component repair, modification or quality control.

12 Claims, 3 Drawing Sheets

| | Compound Designation |
|---|---|
|  | 1A |
|  | 2A |
|  | 3A |
|  | 4A |
|  | 5A |

METHOD OF MAKING THERMALLY REMOVABLE EPOXIES

This invention was made with Government support under Contract No. DE-AC04-94AL85000 awarded by the Department of Energy. The Government has certain rights in the invention.

BACKGROUND OF THE INVENTION

The invention relates to thermally-removable epoxies. More particularly, the invention relates to thermally-removable epoxies prepared using the Diels-Alder cycloaddition reaction and their method of making.

Epoxies are commercially used as solids for a wide variety of applications, including extensive use in the microelectronics industry. For example, printed circuit boards generally have epoxy in them. Epoxies are useful in that they tend to provide structural integrity, including solvent resistance and mechanical strength.

The reaction between oxirane (or epoxide) groups and amines form the basis for many technically important coatings, adhesives, and structural composites, especially those containing reinforcing fibers, known as epoxies. These epoxy materials are generally formed from two liquid components, one containing oxirane (epoxide) end-groups and the other primary or secondary amines. These components are mixed just prior to use and reaction ensues at room temperature, proceeding until it becomes diffusion limited. Chemical cross-linking occurs during the reaction to form an insoluble cross-linked epoxy thermoset. A thermoset compound is a polymer that softens when initially heated, then hardens and condenses in bulk to retain a permanent shape; the thermoset material cannot be softened or reprocessed by re-heating.

The reaction of condensation is, for secondary amines:

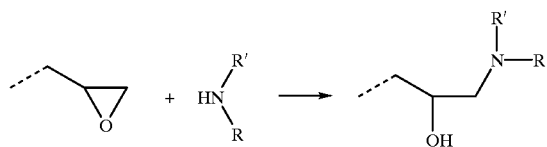

and for primary amines (each primary amine acts as a difunctional molecule):

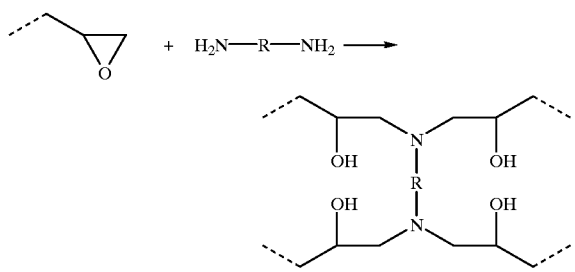

Thus dioxirane compounds (diepoxides) can be crosslinked by diamines (for example with 1,6-diaminohexane) which are tetrafunctional. The use of polyamines and polyimines will lead to gelation at very low conversions.

For composite structures, aromatic diamines are preferred, and the mixed resin after gelation is progressively heated to temperatures above the ever-increasing glass transition to induce the greatest possible extent of reaction of the amine groups with the oxirane groups, so as to avoid subsequent sensitivity to moisture.

In the formation of epoxies, the presence of hydroxy groups and amine groups promotes substantial hydrogen bonding that can occur between polymer chains. The chemical crosslinks and the hydrogen bonding inherent in epoxies cause them to be insoluble, unprocessable thermosets. Because epoxies are used to encapsulate a wide variety components that are becoming ever more costly, it would be useful to develop epoxies that are removable/reversible. This would allow for epoxy removal and component recovery; for example, for repair or component replacement.

Dickie et al. (U.S. Pat. No. 4,687,812, issued on Aug. 18, 1987) describe the formation of epoxy resins using diene functional aminoepoxy resins and dieneophile functional aminoepoxy resins. Meurs (U.S. Pat. No. 5,641,856, issued on Jun. 24, 1997) describes a remoldable cross-linked resin obtained from reacting a dienophile and a 2,5-dialkylsubstituted furan. The furans are substituted at both the 2 and 5 positions to prevent unwanted side reactions that cause irreversible crosslinking; the furans may also be substituted at the 3 and 4 positions with alkyl or alkyloxy groups. Meurs utilizes polymeric furans as the diene compounds; as polymeric solids, the reaction temperatures must be sufficiently high to allow mixing of the reactants. As shown in the examples of Meurs, the reaction temperature is 150° C. or higher. The remolding is carried out at a temperature above 80° C., more preferably above 110° C., and in particular above 140° C. The higher reaction temperature required by using solids as reactant is a significant disadvantage. Iyer and Wong (U.S. Pat. No. 5,760,337, issued on Jun. 2, 1998, and U.S. Pat. No. 5,726,391, issued on Mar. 10, 1998) describe thermally reworkable binders for semiconductor devices wherein the reworkable binders comprise a crosslinked resin produced by reacting at least one dienophile with a functionality greater than one with at least one 2,5-dialkyl substituted furan-containing polymer with a. filler material. Iyer and Wong ('391) also discuss that the furans are substituted at both the 2 and 5 positions to prevent unwanted side reactions that cause irreversible crosslinking. As in Meurs, polymeric furans are utilized as the diene compounds; as polymeric solids, the reaction temperatures must be sufficiently high to allow mixing of the reactants. Due to the viscosity of the polymeric furans, the reworking temperature of this system is 100° C. and preferably from about 130° C. to about 250° C.

A thermally reversible curing system with lower curing and reworking temperatures would be useful in certain applications, such as in microelectronics applications where encapsulation at high temperatures might degrade the components. Useful also would be reactants that are liquid at or near room temperature to provide easier encapsulation processing. This property would also facilitate de-encapsulation.

SUMMARY OF THE INVENTION

According to the method of the present invention, a thermally-removable epoxy can be prepared by mixing a bis(maleimide) compound to a monomeric furan compound, with the monomeric furan compound containing an oxirane group, to form a di-epoxy mixture. A curing agent, such as an amine curing agent, is added to this di-epoxy mixture and the resulting mixture is cured at temperatures from approximately room temperature to less than approximately 90° C. to form a thermally-removable epoxy. The epoxy has the property that subsequent heating to a temperature greater than approximately 90° C. will depolymerize the solid. The depolymerization rate is increased by heating in a polar solvent, such as n-butanol, N,N-dimethylacetamide, methyl sulfoxide, and N,N-dimethylformamide.

In one embodiment, the monomeric furan and bis (maleimide) mixture is a liquid at a temperature of less than approximately 60° C. This facilitates rapid reaction to form the di-epoxy mixture.

In another embodiment, a second di-epoxy compound is added to the first before curing. A filler can be added to the di-epoxy compound mixture to be subsequently cured to form a syntactic foam. Again, this foam can be easily removed at temperatures less than approximately 90° C. In another embodiment, a bubble nucleating agent, a foaming agent, and a surfactant is added to the di-epoxy mixture to form a foam precursor, where, upon heating, forms a thermally-removably epoxy foam.

DESCRIPTION OF SPECIFIC EMBODIMENTS

Figure 1:
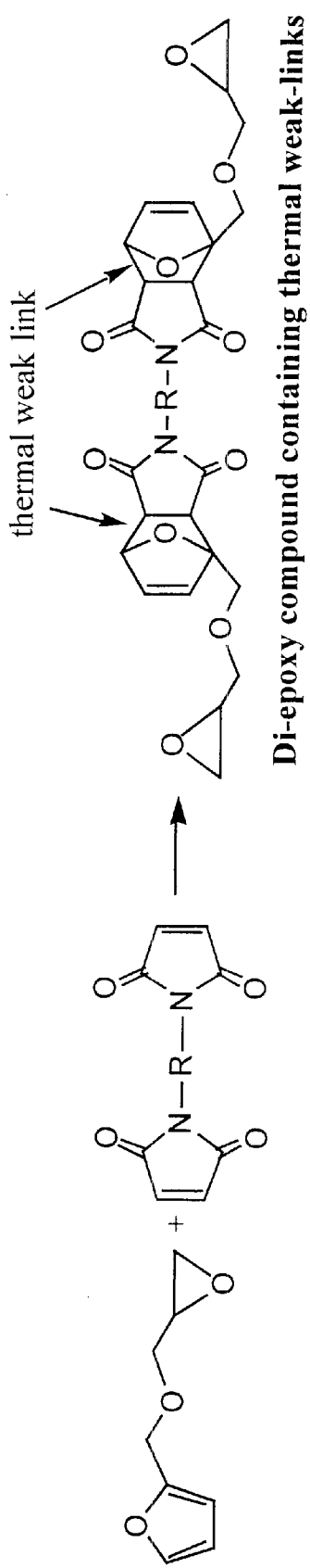
FIG. 1 shows the di-epoxy compound structure containing the furan-maleimide Diels-Alder thermal weak link.

The present invention is a method of making a thermally removable epoxy by utilizing Diels-Alder reactions in the preparation to incorporate thermally-weak linkages in the prepared compound. Diels-Alder reactions between a diene and a dienophile, typically reversible, are known and potentially useful in forming cross-linked materials. The rate of reaction between a diene and dienophile is determined by the diene and dienophile used. Likewise the rate of the reverse reaction (for depolymerization) is also determined by the individual components and the substituents on them. Typically, upon heating, the position of the equilibirum between adduct and dienophile/diene shifts to increase the amount of the diene and dienophile. The reversible Diels-Alder reaction of a maleimide, the dienophile, with functional group R, and a furan, the diene, with functional group R', is known to proceed forward rapidly at 60° C.; however, at a higher temperature, depending upon the particular reactants used, the equilibrium shifts to regenerate the maleimide and furan groups. A wide variety of functional groups are tolerated by the Diels-Alder reaction. In general, any organic functional group can be used for R or R' where the functional group does not undergo a preferential Diels-Alder reaction.

According to the method of the present invention, a bis-maleimide is first mixed with a monomeric furan, generally a tris(furan) or a tetrakis(furan), containing an oxirane group to get a di-epoxy compound. The reaction proceeds more quickly and effectively when at least one of the reactants is a liquid at less than approximately 60° C. and preferably a liquid at approximately room temperature. The reaction can also proceed quickly if at least one of the reactants is a liquid at less than approximately 60° C. if the other reactant is soluble in the liquid reactant. When the reactants are liquids at temperatures less than approximately 60° C., the epoxy can be formed within several minutes. A curing agent, preferably an amine curing agent, is then added to form the thermally removable epoxy containing the Diels-Alder thermally-weak linkages. Importantly, the curing agent is added after di-epoxy has been formed because reactions trying to incorporate the Diels-Alder thermally-weak linkages into the amine curative results in the maleimide compounds reacting with the amines in a Michael addition, inhibiting the formation of an amine compound with thermally-weak linkages.

The formed epoxy has the advantageous characteristics of normal thermosetting epoxies in that it cures into a solid that has good structural integrity, resisting solvents and mechanical stress. However, the epoxy has the added advantageous characteristic of being capable of removal by heating the epoxy to a mildly elevated temperature, generally approximately 60° C. or higher. In general, the removal is enhanced by heating the epoxy in the presence of a polar solvent, such as n-butanol, N,N-dimethylacetamide, methyl sulfoxide, and N,N-dimethylformamide.

Figure 2:
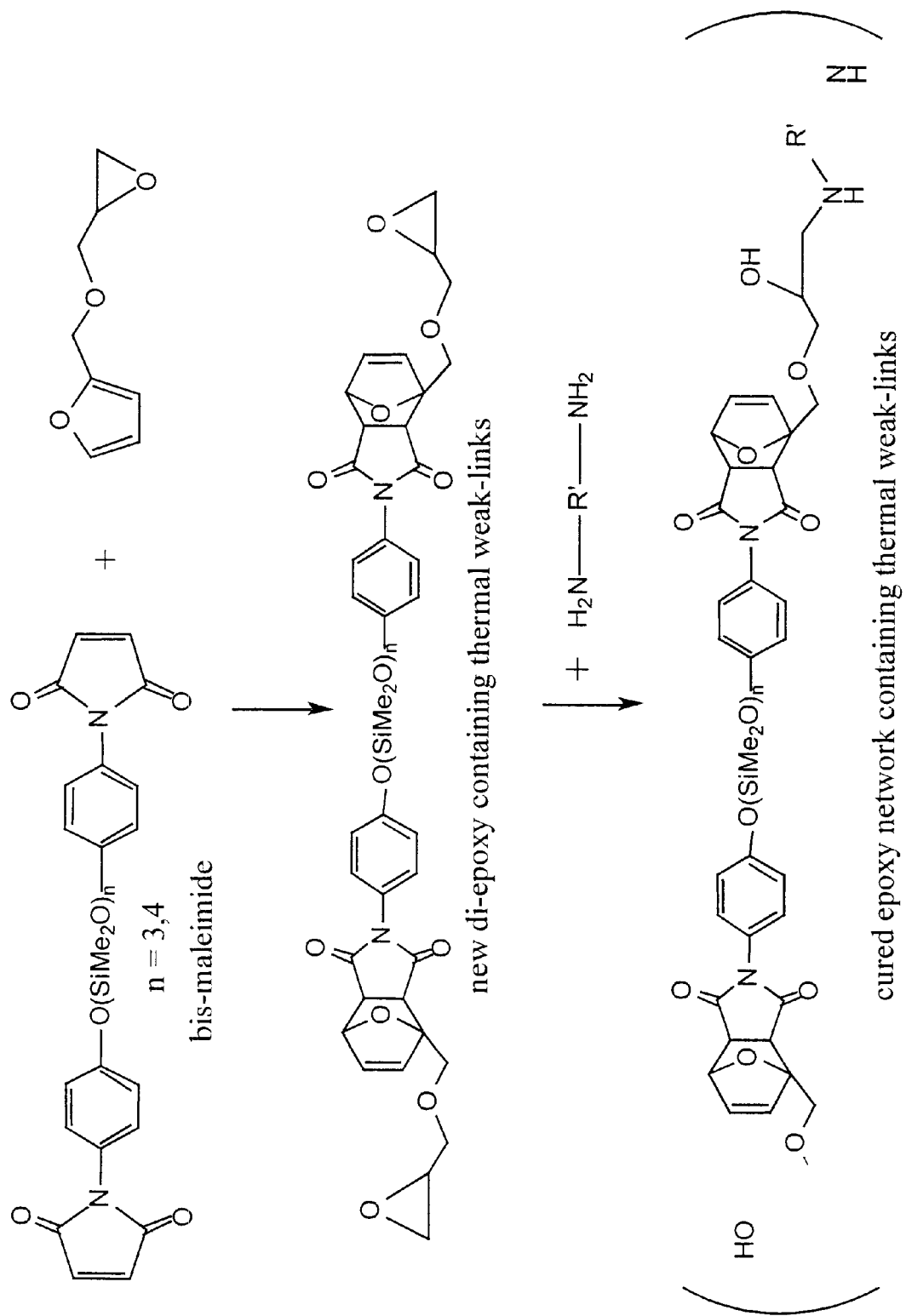
FIG. 2 shows the reaction scheme to form a thermally removable epoxy.

A general formula for the di-epoxy compound structure containing the furan-maleimide Diels-Alder thermal weak link incorporated into the backbone of the polymer is shown in FIG. 1. This di-epoxy compound must be formed prior to curing with any amine curing agent. Therefore the reaction can not be done in-situ with all reactants present. The di-epoxy compound containing the thermal weak link shown in FIG. 1 can be cured with any diamine curative. This general reaction scheme to form a thermally removable/reversible epoxy is shown in FIG. 2.

Figure 3:
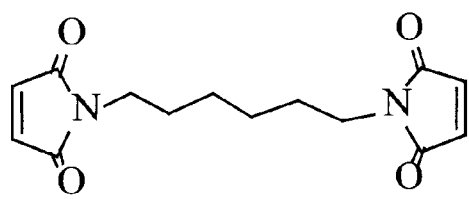
FIG. 3 shows typical bis(maleimide) compounds that can be used in the present invention.
Figure 3:
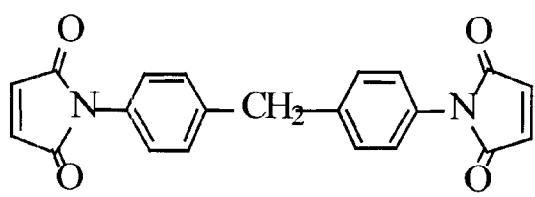
Figure 3:
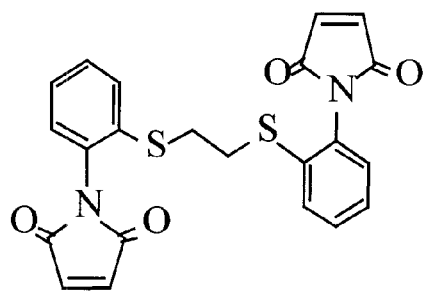
Figure 3:
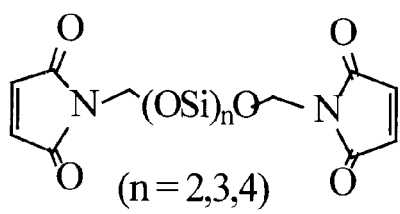
Figure 3:
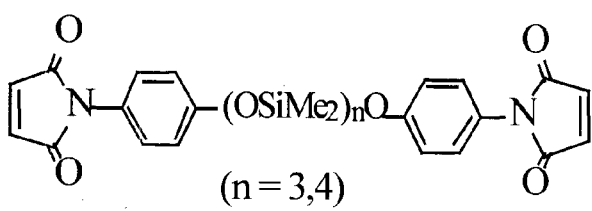

Any number of bis-maleimides can be used to make the di-epoxy containing the thermal weak link, including those shown in FIG. 3. The compounds in FIG. 3 are designated as 1A, 2A, 3A, 4A, 5A (n=3) and 5A (n=4) for ease of identification in the method of the present invention. For example, using the compound in FIG. 3 designated as 5A (n=3 or n=4), which is a liquid at approximately room temperature, a di-epoxy compound containing weak links and thermally removable epoxy network was formed. In one embodiment, a new di-epoxy compound was formed by mixing 5A (n=4) (18.93 g, 28.8 mmol) with furfuryl glycidyl ether (8.89 g, 57.6 mmol) at room temperature for one hour. The reaction mixture was then heated to 60° C. for 24 hours. The di-epoxy compound was then used without further purification. The new di-epoxy compound, containing the siloxane backbone (n=4), was mixed with some commercially available di-epoxy (Epon 8121, manufactured by Shell Chemical Corporation) in a ratio of 60/40 (w/w) (60% removable di-epoxy (1.02 g)/ 40% commercial di-epoxy (Epon 8121, 0.68 g)). This di-epoxy mixture was then simultaneously foamed and cured with a stoichiometric amount of commercial diamine curatives (0.50 g of Ancamine 2049, manufactured by Air Products & Chemical Corporation and 0.38 g of Epicure 3270 manufactured by Shell Chemical Corporation). The foaming process consisted of adding carbon black (0.03 g) (as a bubble nucleating agent), fluorinated solvent (0.17 g of Fluorinert FC-72, manufactured by 3M Corporation) (as a foaming agent), and a surfactant (0.10 g of DC-193, manufactured by Air Product & Chemical Corporation) (for foam stability) to the above mixture and heating at 65° C. for at least 4 hours. The result was a black foam with a density of 0.313 and a glass transisition temperature ($T_g$) of 56.5° C.

Epon 8121 is a bisphenol resin with acrylated phenols. Curing agent Ancamine 2049 is a 3-3'-dimethylmethylenedi (cyclohexylamine). Curing agent Epicure 3270 contains n-aminoethyl piperazine, diethylene triamine, and nonyl phenol. The blowing agent FC-72 is a perfluorinated solvent, primarily with compounds containing 6 carbons. The surfactant DC-193 is an ethylene oxide-propylene oxide siloxane block polymer.

A printed circuit board was embedded in the removable epoxy foam. A piece of this material was submersed in hot n-butanol (at a temperature greater than 90° C.), and the foam completely broke up and went into solution. A piece was also submersed in room temperature n-butanol, and the foam did not break up at all. As a comparison, a piece of traditional cured epoxy foam (known not to be easily removable) was exposed to hot and cold n-butanol, and did not break apart in either one. The new epoxy foam made according to the present invention is thus shown to be a removable foam as a result of incorporating the thermally reversible furan-maleimide Diels-Alder adduct.

In another embodiment, the new removable di-epoxy (1.6 g) was again mixed 60/40 (w/w) with a commercially available epoxy (Epon 8121, 1.2 g), and this mixture was filled with glass microballoons (0.90 g) (a filler used to make syntactic foams). Two commercially available diamine curatives (Ancamine 2049, 1.05 g and Epicure 3270, 0.45 g) were then added in stoichiometric amounts. This pasty material was used to encapsulate a computer component, and the whole assembly was cured at 65° C. overnight. This resulting syntactic foam had a glass transisition temperature of 63.2° C. When heated in n-butanol, essentially all of the encapsulant epoxy was removed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A method of making a thermally-removable epoxy, comprising the steps of:
   mixing a bis(maleimide) compound with a monomeric furan compound, said monomeric furan compound containing an oxirane group, to form a di-epoxy mixture; and
   adding an amine curing agent to form a thermally-removable epoxy, wherein the epoxy has the property that subsequent heating to a temperature greater than approximately 90° C. will depolymerize the solid.

2. The method of claim 1 wherein the monomeric furan is selected from the group consisting of tris(furans) and tetrakis(furans).

3. The method of claim 1 wherein the curing agent is 3-3', dimethylmethylenedi(cyclohexylamine).

4. The method of claim 1 wherein the bis(maleimide) compound is a liquid at a temperature of approximately 60° C.

5. The method of claim 1 wherein the monomeric furan compound is a liquid at a temperature of approximately 60° C.

6. The method of claim 1 wherein the epoxy is formed within approximately 10 minutes.

7. The method of claim 1 wherein the bis(maleimide) compound is selected from the group consisting of compounds $(C_4H_2O_2N)_2(CH_2)_6$, $((C_4H_2O_2N)C_6H_4)_2CH_2$, $((C_4H_2O_2N)C_6H_4)_2(SCH_2)_2$, $((C_4H_2O_2N)C_6H_4)_2(OSi(CH_3)_2)_3O$, and $((C_4H_2O_2N)C_6H_4)_2(OSi(CH_3)_2)_4O$.

8. The method of claim 1 wherein a filler is added to said mixture.

9. The method of claim 8 wherein the filler is glass microballoons.

10. The method of claim 1 wherein a second di-epoxy compound is added to said di-epoxy mixture to form a second di-epoxy mixture.

11. The method of claim 10 wherein the second di-epoxy compound is a bisphenol resin with acrylated phenols.

12. A method of making a thermally-removable epoxy, comprising the steps of:
   mixing a bis(maleimide) compound, selected from the group consisting of $((C_4H_2O_2N)C_6H_4)_2(OSi(CH_3)_2)_3O$, and $((C_4H_2O_2N)C_6H_4)_2(OSi(CH_3)_2)_4O$, with furfuryl glycidyl ether, to form a di-epoxy mixture;
   heating said di-epoxy mixture;
   adding a second di-epoxy compound to form a second di-epoxy mixture; and
   adding an amine curing agent to form a thermally-removable epoxy, wherein the epoxy has the property that subsequent heating to a temperature greater than approximately 90° C. will depolymerize the solid.

* * * * *